United States Patent
Lee et al.

(10) Patent No.: US 9,482,798 B2
(45) Date of Patent: Nov. 1, 2016

(54) PLASMONIC NANO-COLOR COATING LAYER AND METHOD FOR FABRICATING THE SAME

(71) Applicant: KOREA INSTITUTE OF SCIENCE AND TECHNOLOGY, Seoul (KR)

(72) Inventors: Kyeong Seok Lee, Seoul (KR); Won Mok Kim, Seoul (KR); Taek Sung Lee, Seoul (KR); Wook Seong Lee, Seoul (KR); Doo Seok Jeong, Wonju-si (KR); Inho Kim, Seoul (KR)

(73) Assignee: Korea Institute of Science and Technology, Seoul (KR)

(*) Notice: Subject to any disclaimer, the term of this patent is extended or adjusted under 35 U.S.C. 154(b) by 201 days.

(21) Appl. No.: 14/219,506

(22) Filed: Mar. 19, 2014

(65) Prior Publication Data
US 2015/0116856 A1    Apr. 30, 2015

(30) Foreign Application Priority Data
Oct. 31, 2013  (KR) .................. 10-2013-0130712

(51) Int. Cl.
*G02B 5/20*    (2006.01)
*C23C 16/06*   (2006.01)
(Continued)

(52) U.S. Cl.
CPC ........... *G02B 5/206* (2013.01); *C23C 14/0015* (2013.01); *C23C 14/0688* (2013.01);
(Continued)

(58) Field of Classification Search
CPC ........... G01N 33/54373; G01N 21/55; G01N 21/553; G01N 21/554; G01N 21/658; G01N 2021/59; G01N 2021/5903; G02B 1/10; G02B 5/008; G02B 5/0816; G02B 5/0825; G02B 5/085; G02B 5/0858; G02B 5/0875; G02B 5/201; G02B 5/206; G02B 5/26; G02B 5/28; G02B 6/1226; C23C 14/0015; C23C 14/0688; C23C 14/3464; Y10S 977/932; B82Y 20/00

See application file for complete search history.

(56) References Cited

U.S. PATENT DOCUMENTS 5,863,321 A * 1/1999 Crumley .................. C09C 1/64
                                                    106/403
RE37,412 E    10/2001 Aussenegg et al.
(Continued)

FOREIGN PATENT DOCUMENTS

JP    2006-208057 A    8/2006
JP    4947253 B2       3/2012
KR    10-0961488 B1    6/2010

OTHER PUBLICATIONS

Bauer, G., et al. "Resonant nanocluster technology—from optical coding and high quality security features to biochips," *Nanotechnology*, vol. 14, No. 12, Nov. 4, 2003, pp. 1289-1311.
(Continued)

*Primary Examiner* — Bumsuk Won
*Assistant Examiner* — Ephrem Mebrahtu
(74) *Attorney, Agent, or Firm* — NSIP Law

(57) ABSTRACT

A plasmonic nano-color coating layer includes a composite layer including a plurality of metal particle layers and a plurality of matrix layers and having a periodic multilayer structure in which the metal particle layers and the matrix layers are alternately arranged, a dielectric buffer layer located below the composite layer, and a mirror layer located below the dielectric buffer layer, wherein the color of the plasmonic nano-color coating layer is determined based on a nominal thickness of the metal particle layer and a separation between the metal particle layers.

26 Claims, 11 Drawing Sheets

(51) Int. Cl.
*G02B 5/00* (2006.01)
*G02B 5/26* (2006.01)
*C23C 14/00* (2006.01)
*C23C 14/06* (2006.01)
*C23C 14/34* (2006.01)
*B82Y 20/00* (2011.01)

(52) U.S. Cl.
CPC ........... *C23C14/3464* (2013.01); *G02B 5/008* (2013.01); *G02B 5/26* (2013.01); *B82Y 20/00* (2013.01); *Y10S 977/932* (2013.01)

(56) References Cited

U.S. PATENT DOCUMENTS

| | | | |
|---|---|---|---|
| 7,486,400 B2 | 2/2009 | Saito | |
| 7,935,414 B2* | 5/2011 | Ounaies | B32B 27/20 428/141 |
| 2006/0194344 A1 | 8/2006 | Saito | |
| 2007/0141342 A1 | 6/2007 | Kuehnle et al. | |
| 2008/0198376 A1* | 8/2008 | Poponin | G01N 21/658 356/301 |
| 2012/0257204 A1* | 10/2012 | Walters | C12Q 1/6837 356/445 |
| 2013/0011616 A1* | 1/2013 | Matsumura | G01N 21/554 428/148 |
| 2014/0036472 A1* | 2/2014 | Ishihara | F21V 33/00 362/23.14 |
| 2014/0205918 A1* | 7/2014 | Schuh | H01M 4/38 429/405 |

OTHER PUBLICATIONS

Kealley, Catherine S., et al. "The versatile colour gamut of coatings of plasmonic metal nanoparticles," *Physical Chemistry Chemical Physics*, vol. 11, No. 28, Jun. 19, 2009, pp. 5897-5902.

* cited by examiner

PLASMONIC NANO-COLOR COATING LAYER AND METHOD FOR FABRICATING THE SAME

CROSS-REFERENCE TO RELATED APPLICATION

This application claims priority to Korean Patent Application No. 10-2013-0130712, filed on Oct. 31, 2013, and all the benefits accruing therefrom under 35 U.S.C. §119, the contents of which in its entirety are herein incorporated by reference.

BACKGROUND

1. Field

Embodiments are related to a nano-color coating technology which uses an optical absorption due to a localized surface plasmon resonance occurring at metal nanoparticles as a coloring mechanism, and more particularly, to a nano-color coating technique for greatly enhancing an optical absorbance due to a localized surface plasmon resonance by employing a resonant structure composed of a composite layer, where metal nanoparticle layers and matrix layers are alternately arranged, and a bottom mirror layer, and also for greatly enhancing the absorption band shift just by controlling a nominal thickness of the metal nanoparticle layer and a separation between the particle layers, and to a method for fabricating the same.

2. Description of the Related Art

A color coating technology for providing a color to a base body is applied to a great variety of technical fields including not only traditional decorative coating but also display color filters, security labels, selective optical absorption layers, tunable optical filters, colorimetric sensors or the like. For such applications, there is a need for an eco-friendly color coating technology which is based on a thin coating layer but ensures excellent color tunability and high chroma in spite of using a relatively simple process and materials combination.

In a traditional wet-coating process using a paint, a coating layer is demanded to have a thickness of at least several tens or hundreds of microns in order to realize a clear color of high Chroma due to the characteristic of an organic dye and is also vulnerable to heat and ultraviolet light. In addition, due to its process nature, it is difficult to entirely exclude hazardous substances harmful against the human body, and thus not eco-friendly.

Meanwhile, a color coating technology using a dry deposition process has advantages that it is eco-friendly and can be adopted to a batch process for manufacturing various opto-electronic materials/devices. Typical ways of coloring are using optical interference effects arising from a periodic multilayer film composed of dielectric layers with different refractive indices, or a Fabry-Perot etalon in which a dielectric layer is sandwiched between two metal films. These coloring methods based on optical interference effect can be disadvantageous in that they basically demand a minimum thickness of the order of the light wavelength and cause a color difference depending on observation angles.

Besides the interference coloring, a simple color coating based on a metal film such as Zr, Ti, Cr, Nb or the like or nitride films of Ti—N system is also widely used for exterior coating of consumer electronics or decorative coating because it can produce several metallic colors such as gold, blue, wine or the like. However, this is not suitable for a current trend towards elegant IT product design since it appears to lack premium feel of metallic sheen and has limitation in the achievable range of colors.

Recently, a new-concept color coating technology using a physical effect pigment is spotlighted as an alternative. In particular, a localized surface plasmon resonance phenomenon occurring at nano-sized metal particles dispersed in optically transparent dielectrics or polymer matrix shows very strong optical absorption spectra in a specific visible wavelength range and thus has been recognized as a promising colorant. The plasmonic nanoparticles not only show a molar extinction coefficient of about $10^5$ times larger than that of a general organic dye but also have the advantages of tuning the surface plasmon resonance wavelength in a wide range by means of the metal species, shape and size of particles, and a combination with a matrix.

However, the plasmonic nano-color coating fabricated by a vacuum deposition process does not generally generate a vivid color with a sufficiently high chroma. A conventional method for enhancing the chroma is to increase a volume fraction of metal nanoparticles to cause sufficient optical absorption or to increase a total thickness of the sample. Such approaches, however, may increase the consumption of precious metal suitable for exciting surface plasmon or give rise to an undesirable interference color due to the increased total thickness of the coloring layer. In addition, since the control of shape and size of particles are highly restricted in the deposition process, in order to realize diverse colors, the combination of metal and matrix should be frequently changed, inconveniently. Therefore, there is a demand for a method for greatly improving a color chroma and hue angle control range while maintaining the materials combination and the total thickness of color coating below a certain extent.

Another previous plasmonic nano-color coating technology employed a Fabry-Perot type resonator structure consisted of a metallic mirror, transparent resonance interlayer, and a metal nanoparticle layer, which made it possible to obtain a relatively clear color of high chroma. However, since the coloring mechanism is still based on the interference effect, the change of color is dominated by the thickness of the dielectric resonance layer, thereby exhibiting interference color attributes.

SUMMARY

An aspect of the present disclosure is directed to providing a color coating layer, which may realize various colors of high chroma just with simple processes and materials combination based on an eco-friendly deposition process, ensure little change in color regardless of viewing angles, and directly reflect the texture of an underlayer, and a method for fabricating the same.

A plasmonic nano-color coating layer according to an embodiment may comprise: a composite layer including a plurality of metal particle layers and a plurality of matrix layers and having a periodic multilayer structure in which the metal particle layers and the matrix layers are alternately arranged; a dielectric buffer layer located below the composite layer; and a mirror layer located below the dielectric buffer layer. The color of the plasmonic nano-color coating layer is determined based on a nominal thickness of the metal particle layer and a separation between the metal particle layers.

A method for forming a plasmonic nano-color coating layer according to an embodiment may comprise: forming a mirror layer on a base body to be colored; forming a dielectric buffer layer on the mirror layer; and forming a composite layer on the dielectric buffer layer, the composite layer including a plurality of metal particle layers and a plurality of matrix layers and having a periodic multilayer structure in which the metal particle layers and the matrix layers are alternately arranged, wherein a nominal thickness of the metal particle layer and a separation between the metal particle layers are determined based on the color to be realized.

The plasmonic nano-color coating layer according to an embodiment of the present disclosure may greatly enhance a selective optical absorbance by using a resonance structure composed of a composite layer where metal nano-particle layers and optically transparent matrix layers are arranged alternately and a lower mirror layer, and also greatly enhance the absorption band shift in a broad wavelength range just by controlling a nominal thickness of the nano-particle layer and a separation between the particle layers.

The plasmonic nano-color coating layer according to an embodiment is an eco-friendly color coating layer using a vapor deposition process and may realize various colors in a broad range just by controlling process variables without changing the materials combination. In particular, when being used as a decorative coating of consumer electronics, the plasmonic nano-color coating layer may realize a high-grade metallic gloss and premium feel of metallic textures with colors.

Moreover, in spite of a very thin thickness of 100 nm or below, the nano-composite color coating layer according to an embodiment may advantageously realize a vivid color of high chroma.

Besides, the color difference according to viewing angles may be diminished to a negligible level in comparison to conventional interference color, and a color to which the texture of an underlayer is directly reflected may be realized.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION

Hereinafter, configuration and features of the present disclosure will be described based on embodiments, but these embodiments just exemplarily describe the present disclosure and are not intended to limit the present disclosure.

Figure 1:
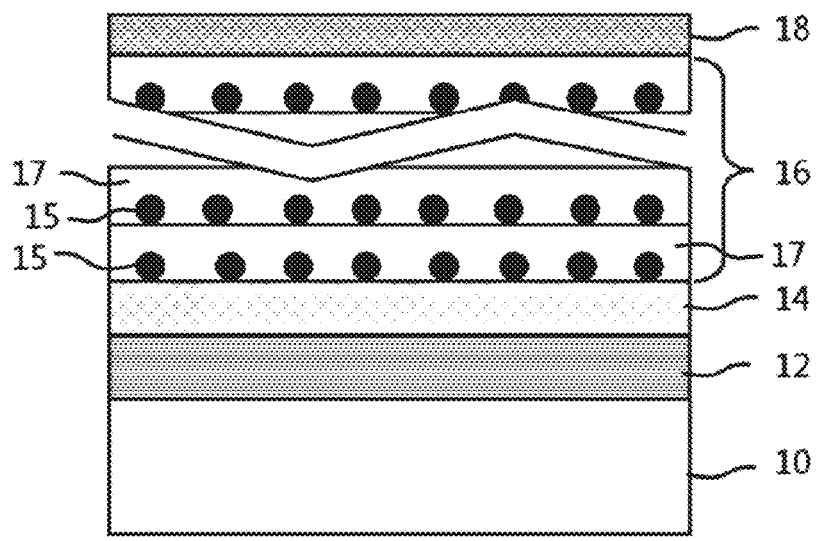
FIG. 1 is a cross-sectional view schematically showing a plasmonic nano-color coating layer according to an embodiment of the present disclosure.

FIG. 1 is a cross-sectional view schematically showing a plasmonic nano-color coating layer according to an embodiment of the present disclosure, and the plasmonic nano-color coating layer may include a composite layer 16 having a plurality of metal nano-particle layers 15 and a plurality of matrix layers 17, a dielectric buffer layer 14 located below the composite layer 16 and a mirror layer 12 located below the dielectric buffer layer 14. The composite layer 16 may have a periodic multilayer structure in which the metal nano-particle layers 15 and the matrix layers 17 are alternately arranged. The plasmonic nano-color coating layer may be formed on a base body 10 to be colored.

If light is incident to the plasmonic nano-color coating layer as shown in FIG. 1, free electrons in the metal particles start to oscillate with an electric field of the incident light, and the oscillation is dielectrically confined in the matrix. Accordingly, a huge dipole moment is induced, and the induced huge dipole moment increases the magnitude of a localized electric field near the metal particle. At this time, the collective oscillation of the free electron cloud in the metal particles induced by the dielectric confinement is quantized with a natural frequency, which is called a localized surface plasmon resonance phenomenon. If the surface plasmon resonance phenomenon occurs, the optical absorption in the resonance wavelength range greatly increases, thereby giving a resultant color.

According to an embodiment of the present disclosure, the plasmonic nano-color coating layer shows a color determined by surface plasmon resonance arising from the combination of the metal nano-particle layer 15 and the matrix layer 17 and an interaction between the composite layer 16 and the mirror layer 12, and this color may be controlled by a thickness of the metal nano-particle layer 15 and a separation between the metal nano-particle layers 15. In this specification, the term 'thickness' means a nominal thickness, unless otherwise noted.

When the materials for the metal nano-particle layer 15 and the matrix layer 17 are fixed, the wavelength of the resonance optical absorption, namely the color of the plasmonic nano-color coating layer, may be easily changed by varying a nominal thickness of the metal nano-particle layer 15. Changing the nominal thickness of the metal nano-particle layer 15 may control the size and surface density of the metal nano-particles, and also has an influence on the shape of the metal nano-particles. Among them, the shape of the metal nano-particles is affected by not only the nominal thickness of the metal nano-particle layer 15 but also a chemical bond strength between the materials of the metal particle layer 15 and of the matrix layer 17. Generally, when the bond strength is small, the metal particles have a spherical shape in an initial growth stage, and as the nominal thickness of the metal nano-particle layer 15 increases, the metal particles begin to coalesce with adjacent particles into an elongated or flattened shape. If the nominal thickness increases further, the isolated particles are linked to each other to form a percolated network structure. Meanwhile, for the case of large bond strength, even though the nominal thickness of the metal particle layer 15 is small, the metal particle has a flattened shape or a percolated network structure. In other words, the change in the nominal thickness of the metal nano-particle layer 15 results in the changes in the shape, size, and surface density of the metal nano-particles, which affects the localized surface plasmon resonance phenomena. Accordingly, the effective dielectric constant of the metal nano-particle layer 15 changes, which in turn modifies an impedance matching condition for minimizing the optical reflectance of the plasmonic nano-color coating layer and the hue value in the color coordinate, resulting in change in the color realized.

According to an embodiment of the present disclosure, the plasmonic nano-color coating layer may further include a protective layer 18 located on the metal nano-particle layer 15. The protective layer 18 is a coating layer for protecting the plasmonic nano-color coating layer against environmental influences and mechanical frictions to improve durability, chemical resistance and abrasion resistance, and may use either organic or inorganic materials if they are optically transparent.

The materials constituting the metal nano-particle layer 15 may be precious metals whose optical behavior is described as a free electron model. In an embodiment, the material constituting the metal nano-particle layer 15 may be selected from Ag, Au, Cu, Al, Pt, Pd, Ni, Co, Fe, Mn, Cr, Mo, W, V, Ta, Nb, Sn, Pb, Sb, Bi and their alloys.

The materials constituting the matrix layer 17 may be selected from any of organic materials, inorganic materials, their compounds and their mixtures without any restriction, if they are optically transparent or has low optical absorption. For example, the materials may be any of inorganic materials composed of oxide such as $SiO_2$, $TiO_2$, $Al_2O_3$, MgO, ZnO, $ZrO_2$, $In_2O_3$, $SnO_2$, CdO, $Ga_2O_3$, $Y_2O_3$, $WO_3$, $V_2O_3$, $BaTiO_3$ and $PbTiO_3$, nitride such as $Si_3N_4$, $Al_3N_4$ or the like, phosphate such as InP, GaP or the like, sulfide such as ZnS, $As_2S_3$ or the like, fluoride such as $MgF_2$, $CaF_2$, NaF, $BaF_2$, $PbF_2$, LiF, LaF or the like, their mixtures or their compounds; organic materials such as polycarbonate, polymethyl methacrylate (PMMA), poly dimethyl siloxane (PDMS), cyclic polyolefin, styrene-based polymer or Teflon; their compounds; or their mixtures.

The dielectric buffer layer 14 may also unlimitedly use any of organic materials, inorganic materials, their compounds and their mixtures, if it is optically transparent or has low optical absorption, similar to the matrix layer 17. It is desired that the material of the dielectric buffer layer 14 is identical to the material of the matrix layer 17 in view of the convenience of process, but the material of the dielectric buffer layer 14 may also be different from the material of the matrix layer 17 in order to give a function like a diffusion barrier.

The mirror layer 12 may be made of metallic materials with high optical reflectivity. The materials constituting the mirror layer 12 may use white metals such as Al, Ag, Sn, In, Pt, Pd, Ni, Cr, Pb, Fe, Mo, W, Mn, Nb, Sb or the like, colored metals such as Au, Cu, Co, Zr or the like, nitride such as Al—N, Ti—N, Zr—N, Ta—N, carbide such as Ti—C, W—C, Zr—C, their compounds and their mixtures.

Figure 2:
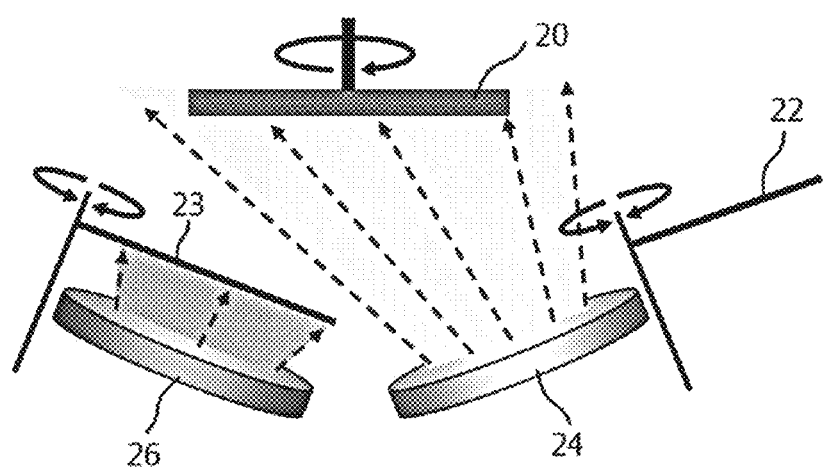
FIG. 2 illustrates a shutter system used for an alternate deposition process of a metal nano-particle layer and a matrix layer according to an embodiment of the present disclosure.

FIG. 2 is a diagram for illustrating a process of forming a plasmonic nano-color coating layer according to an embodiment of the present disclosure.

The process for forming a plasmonic nano-color coating layer may include: forming a mirror layer on a base body to be colored; forming a dielectric buffer layer on the mirror layer; and forming a composite layer on the dielectric buffer layer, the composite layer including a plurality of metal particle layers and a plurality of matrix layers and having a periodic multilayer structure in which the metal particle layers and the matrix layers are alternately arranged, wherein a thickness of the metal particle layer and a separation between the metal particle layers are determined based on the color to be realized.

The plasmonic nano-color coating layer is fabricated by alternately depositing metal nano-particle layers and matrix layers as much as a given thickness, and as shown in FIG. 2, the alternate deposition of metal nano-particle layers and matrix layers may be performed using a shutter 22, 23 system. The metal nano-particle may be formed based on a Volmer-Weber type three-dimensional island growth mode in an early stage of film growth. When depositing a metal film on the dielectric buffer layer or the matrix layer, the nominal thickness of the metal film is controlled smaller than a transition thickness where the film growth mode changes from an initial nucleation stage of the film growth to a layered growth mode exhibiting two-dimensional continuous layer structure, thereby obtaining the nanoparticle layer consisted of individually isolated three-dimensional islands. When a metal particle layer with a nominal thickness predetermined is formed, the shutter 23 is closed, and the matrix layer is deposited to a substrate 20 on which the base body is placed. The matrix layer is grown as a continuous layer. When a matrix layer of a given thickness is formed, the shutter 22 is closed, and the metal particle layer is deposited again. By repeating the above process, a nano-composite coating layer where a plurality of metal particle layers and a plurality of matrix layers are alternately deposited is finally prepared. For the deposition of metal-particle layer and matrix layer, almost all kinds of physical vacuum deposition methods including sputtering, resistive heating, electron beam, ion beam, laser irradiation or the like, a chemical vapor deposition method, a spray coating method or the like may be applied. The alternate deposition may employ any available method, for example a method of alternately exposing a substrate, to which a coating layer is to be deposited, to the source materials for the deposition of metal and matrix layers by means of translation or a rotation bar, in addition to the method using shutter systems which are alternately opened.

Hereinafter, the change in colors of the plasmonic nano-color coating layer depending on the change of a nominal thickness of the metal nano-particle layer will be described with reference to FIGS. 3 and 4.

Figure 3:
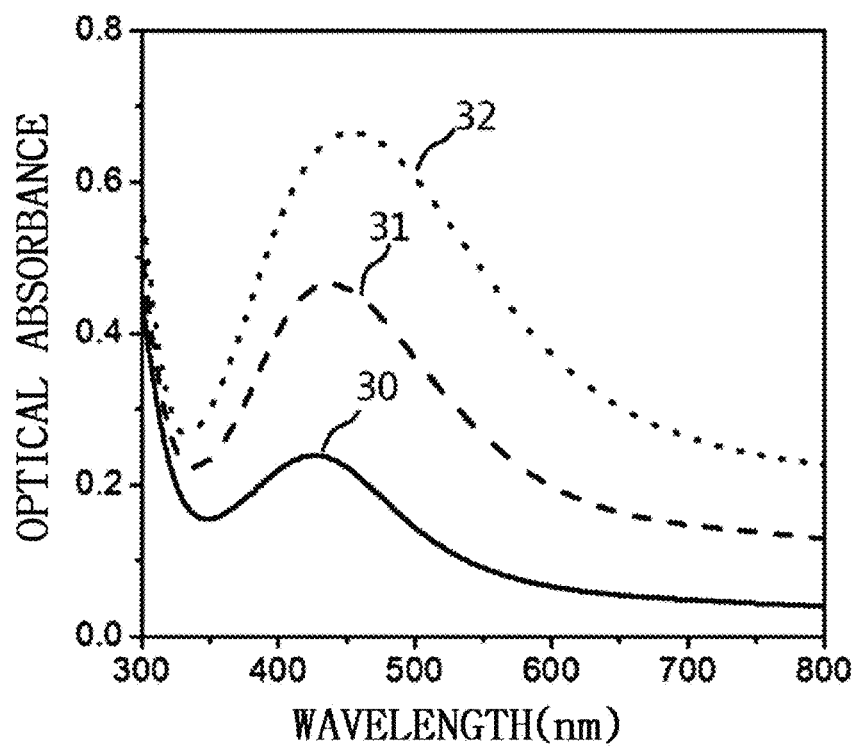
FIG. 3 illustrates an optical absorbance spectrum of a plasmonic nano-color coating layer not including a mirror layer.

FIG. 3 shows the optical absorbance spectra of the plasmonic nano-color coating layer which does not include a mirror layer below the composite layer. The optical absorbance is defined as log(1/T) or log(1/R) by using an optical transmittance (T) or an optical reflectance (R) which is a ratio of a transmitted or reflected light to the incident light and has a value of 0 to 1. After a $SiO_2$ dielectric buffer layer of 10 nm thickness was deposited on a glass substrate, Ag nano-particle layers and $SiO_2$ matrix layers were alternately deposited on it to have total 5 layers each. Here, the thickness of $SiO_2$ matrix layer was 5 nm, while the nominal thicknesses of Ag nano-particle layer were varied to have 1 nm (30), 2 nm (31), 3 nm (32) for different samples. As the nominal thickness of the Ag nano-particle layer increases, the overall optical absorbance clearly tends to increase proportionally, while the resonance wavelength where the maximum optical absorption appears is just slightly red-shifted near 430 nm without noticeable change, giving rise to a light yellowish color as a whole, as shown in FIG. 3.

Figure 4:
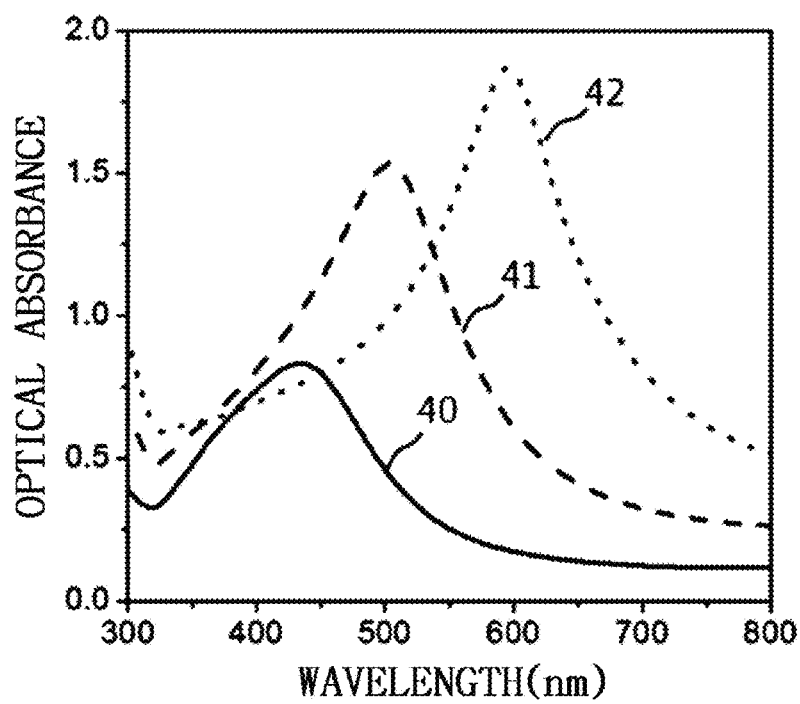
FIG. 4 illustrates an optical absorbance spectrum as a function of a nominal thickness of a metal nano-particle layer in the plasmonic nano-color coating layer according to an embodiment of the present disclosure.

FIG. 4 shows the optical absorption curves of plasmonic nano-color coating layers which further include a mirror layer below the composite layer in the multilayer stack of the samples used in FIG. 3. An Al film with 100 nm thickness was used as the mirror layer. Quite differently from the case of FIG. 3, as the nominal thickness of the Ag nano-particle layer increases to 1 nm (40), 2 nm (41), and 3 nm (42), the resonance wavelengths of a maximum optical absorption significantly red-shifted to 434 nm, 504 nm, and 595 nm, respectively. As a result, the color of the plasmonic nano-color coating layer was clearly changed, exhibiting vivid metallic gold, red and blue colors with increasing the nominal thickness of the Ag nano-particle layers. In addition, the overall optical absorbance also increased more than three times in comparison to that of FIG. 3.

According to an embodiment of the present disclosure, in order to optimize the enhancement of selective optical absorbance through the coupling with an asymmetric Fabry-Perot resonance phenomenon without damping, the dielectric buffer layer and/or the matrix layer in the plasmonic nano-color coating layer may have a thickness of 1 nm to 30 nm.

Hereinafter, the influence of the thickness of the dielectric buffer layer and the matrix layer on the optical absorbance of the plasmonic nano-color coating layer will be described with reference to FIGS. 5 to 8.

Figure 5:
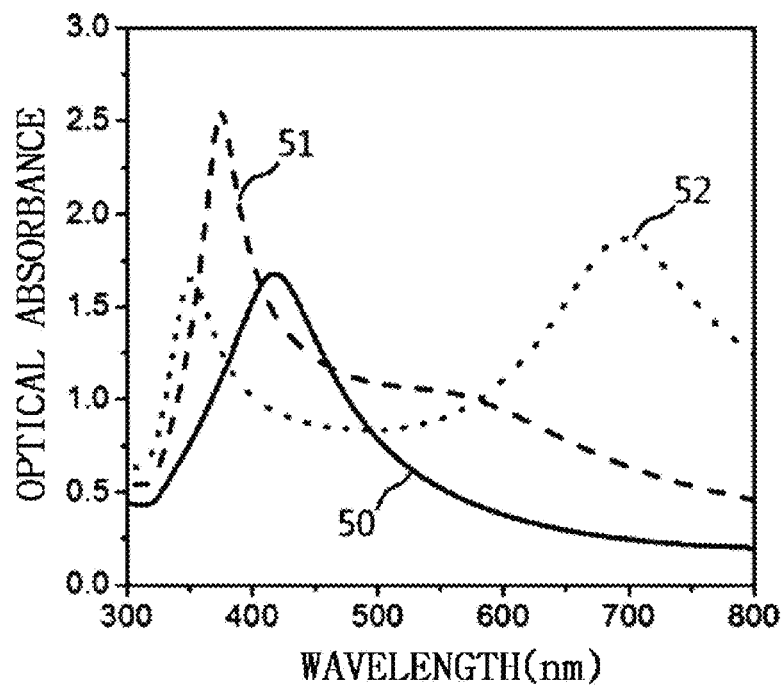
FIG. 5 illustrates an optical absorbance spectrum as a function of a nominal thickness of the metal nano-particle layer when the dielectric buffer layer in the plasmonic nano-color coating layer according to an embodiment of the present disclosure has a thickness of 30 nm.

FIG. 5 shows the optical absorbance curves of samples in which only the thickness of the $SiO_2$ dielectric buffer layer increases to 30 nm in the same structure as that of the samples used in FIG. 4. In this case, even though the nominal thickness of the Ag nano-particle layer increases to 1 nm (50), 2 nm (51), and 3 nm (52), the gradual red-shift of the resonance wavelengths was not observed. When the dielectric buffer layer has a thickness of several nm, up to about 20 nm, the impedance matching wavelength appears to be consistently controlled as a function of nominal thickness of the metal nano-particle layer due to the interaction between the localized surface plasmon resonance effect by the metal nano-particle layer and the mirror layer.

However, if the thickness of the dielectric buffer layer increases over about 30 nm, the interaction is thought to be negligible. If the thickness increases further, contribution from the optical interference due to the dielectric buffer layer tends to increase. The suitable combination of mirror layer and the composite layer with a periodic multilayered structure shows an impedance matching phenomenon of zero reflectance, which may be ascribed to a magnetic resonance effect arising from an interaction between metal-particle dipoles and their image dipoles induced in the mirror layer spaced by the dielectric buffer layer, and an amplified phase shift effect induced in this highly absorptive multilayered resonance structure. Meanwhile, if the dielectric buffer layer is absent or the thickness is too small, a conductive coupling occurs between the metal particle and the mirror layer which causes the damping of surface plasmon and makes the impedance matching condition not satisfied. Therefore, in an embodiment, the dielectric buffer layer may have a thickness of 1 nm to 30 nm. In addition, in an embodiment, the dielectric buffer layer may have a thickness of 1 nm to 20 nm.

Figure 6:
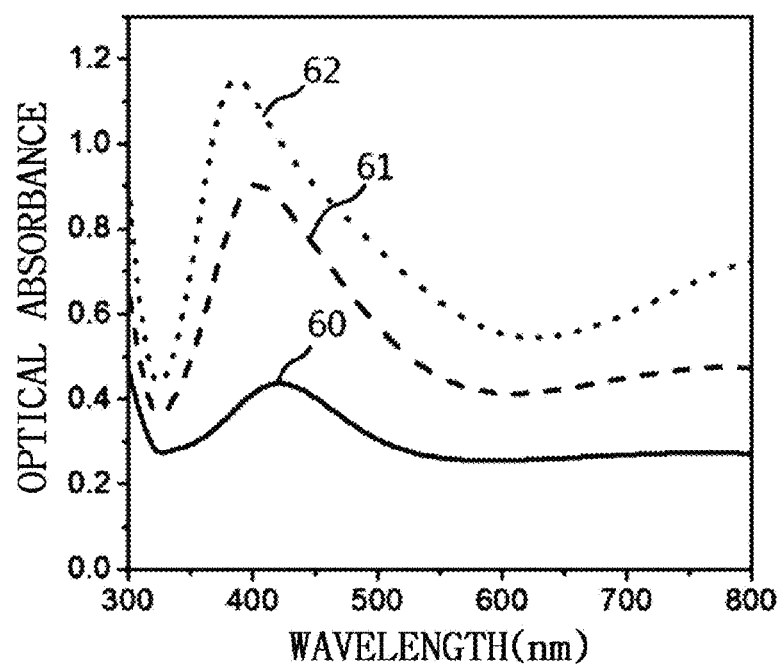
FIG. 6 illustrates an optical absorbance spectrum as a function of a nominal thickness of the metal nano-particle layer when the matrix phase layer in the plasmonic nano-color coating layer according to an embodiment of the present disclosure has a thickness of 20 nm.

FIG. 6 shows the optical absorbance curves of samples which have the same structure as that of FIG. 4 except that the thickness of the $SiO_2$ matrix layer increases to 20 nm, in order to test how the separation between the metal nano-particle layers, namely the thickness of the matrix layer affects the optical absorbance of the nano-color coating layer. In this case, even though the nominal thickness of the Ag nano-particle layer increases to 1 nm (60), 2 nm (61), and 3 nm (62), it was found that the location of the resonance optical absorption wavelength does not change much, namely the color of the plasmonic nano-color coating layer does not change much. In addition, it was found that the optical absorbance enhancement effect was reduced, and almost disappeared when the thickness of the matrix layer increased further. Meanwhile, similar to the thickness effect of dielectric buffer layer, when the matrix layer is too thin, a conductive coupling occurs between the metal particle layers as well. Therefore, the minimum thickness of the matrix layer may be controlled not to cause the conductive coupling between the metal particle layers. In an embodiment, the matrix layer may also have a thickness of 1 nm to 20 nm. In other words, it may be understood that not only the nominal thickness of the metal nano-particle layer but also the thickness of the matrix layer, namely the separation between the metal nano-particle layers controls the color of the plasmonic nano-color coating layer and has an influence on the implementation of high chroma color and the control of color tunability.

Figure 7:
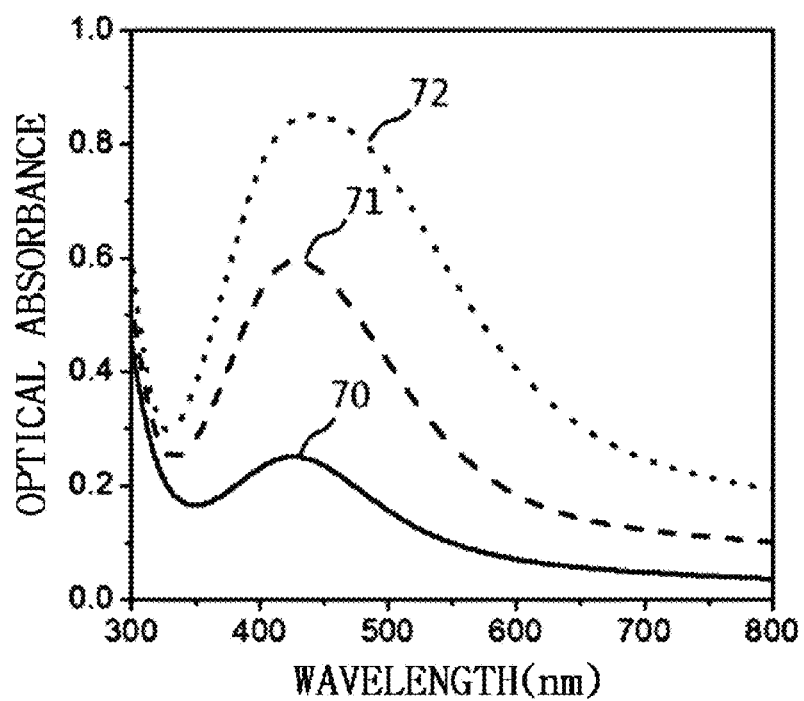
FIG. 7 illustrates an optical absorbance spectrum as a function of a nominal thickness of the metal nano-particle layer when the matrix layer in the plasmonic nano-color coating layer according to an embodiment of the present disclosure has a thickness of 20 nm and there is no mirror layer.

FIG. 7 shows the optical absorbance spectra of samples that have the same structure used in the samples of FIG. 6 except that they have no mirror layer. Compared with the case of FIG. 3 in which the matrix layer has a thickness of 5 nm, if the mirror layer is not provided below the composite layer, it may be found that the overall shape of the optical absorbance curves remains very similar regardless of the thickness of the matrix layer.

Figure 8:
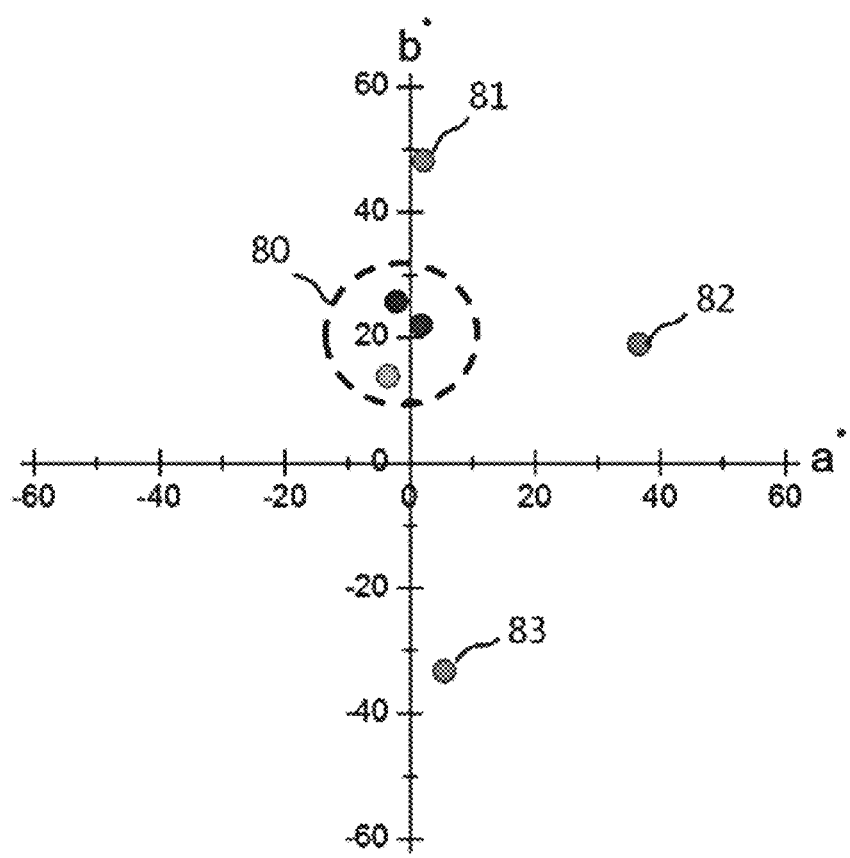
FIG. 8 is a graph showing a color distribution in a*b* plane of a CIE L*a*b* coordinate system represented by a plasmonic nano-color coating layer having a matrix layer with a thickness of 5 nm or 20 nm according to an embodiment of the present disclosure.

In order to quantitatively evaluate the color gamut achievable by the plasmonic nano-color coating layer according to various embodiments of the present disclosure, FIG. 8 or the like shows the color coordinates of samples by employing CIE L*a*b* color space, standardized in 1976 by CIE (Commission Internationale d'Eclairage). The CIE L*a*b* color space is most frequently used method to describe color by visual designers or persons who are working on displays or colors since its color gamut is wide enough to include all perceivable colors in comparison to RGB or CMYK. In the CIE L*a*b* color space, L* represents lightness and has a value ranging from 0 to 100, where 0 represents black and 100 represents a perfect diffuse white. On the other hand, a* and b* have no specific limit in their values. The a* indicates a color position between red and green, and a positive value represents red and a negative value represents green. The b* indicates its position between blue and yellow, and a positive value represents yellow, whiled a negative value represents blue. Chroma representing a vividness or a saturation of color is expressed as $d=\sqrt{(a^*)^2+(b^*)^2}$, which corresponds to a distance from origin to the projected planar a*b* coordinate. The measured spectra of optical reflectance were numerically converted into the color coordinate using a 2° standard observer color matching function and an illuminant D65 corresponding to daylight.

FIG. 8 is a graph showing the color coordinates projected on a*b* plane of CIE L*a*b* space for the samples of FIG. 4 in which the matrix layer has a thickness of 5 nm and the samples of FIG. 6 in which the matrix layer has a thickness of 20 nm. The samples of FIG. 6 in which the matrix layer has a thickness of 20 nm gathered at the color coordinates 80 of light yellow of low chroma regardless of the nominal thickness of the Ag nano-particle layer. However, in the case of the samples in which the matrix layer has a thickness of 5 nm, it was found that the color coordinates significantly change depending on the change in nominal thickness of the Ag nano-particle layer due to the interaction between the Ag nano-particle layers, and their chroma values were also greatly improved in comparison to that of the samples of FIG. 6. The each color coordinate represents a gold 81, a red 82, and a blue 83 color when the nominal thickness of Au nanoparticle layers were 1 nm, 2 nm, and 3 nm, respectively. In addition, when referring to the Hue value defined as a central angle (ranging from 0° to 360°) of the a*b* color circle, it is found that the achievable range of color becomes very wide amounting to 180°, the half circle, as the nominal thickness of the Ag nano-particle layer increases from 1 nm (81) to 3 nm (83). Therefore, even though the plasmonic nano-color coating layer according to an embodiment of the present disclosure has a simple combination of materials, it may be found that by controlling the optical impedance matching of a periodic multilayer stack in which metal nano-particle layers and matrix layers are alternately arranged, the ability to produce wide color gamut is greatly improved in comparison to the conventional metal particle dispersed nano-composite coating technology.

Figure 9:
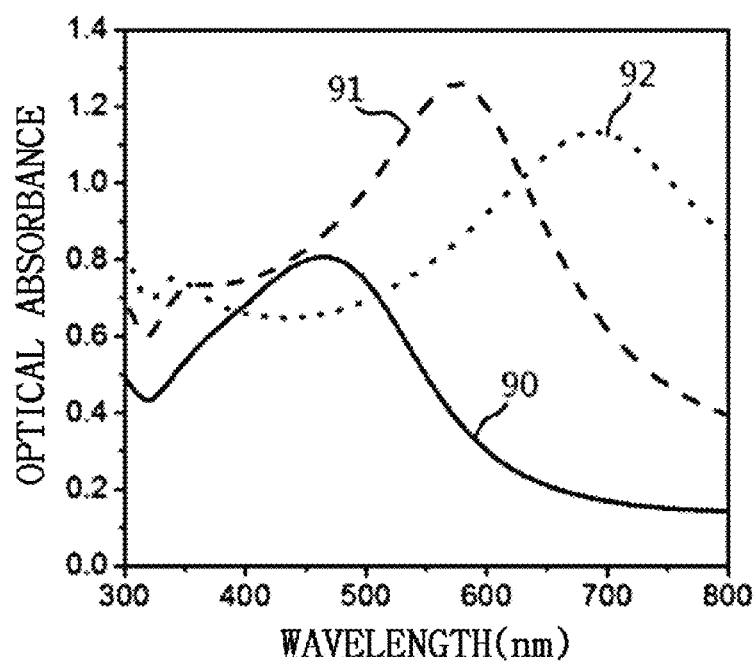
FIG. 9 illustrates an optical absorbance spectrum of a case in which $Al_2O_3$ is used as the matrix layer of the plasmonic nano-color coating layer according to an embodiment of the present disclosure.

Hereinafter, the influence of the change of materials constituting the matrix layer and the dielectric buffer layer on the color of the coating layer will be described with reference to FIGS. 9 and 10. FIG. 9 shows the optical absorbance spectra of samples in which only the materials constituting the matrix layer and the dielectric buffer layer are substituted for $Al_2O_3$ instead of $SiO_2$ used in the samples of FIG. 4. When compared to the optical absorbance spectra of FIG. 4 using the $SiO_2$ matrix, the resonance wavelengths of maximum optical absorbance shifted towards a region of longer wavelength, even though the overall pattern looks similar. In addition, as the nominal thickness of the Ag nano-particle layer increases to 1 nm (90), 2 nm (91), and 3 nm (92), the degree of red-shift increases further. This is ascribed to the increase of a refractive index of the matrix material, and it shows that the wavelength of resonant optical absorption can be controlled not only by the nominal thickness of the metal nano-particle layer but also the change in refractive index of the matrix material.

Figure 10:
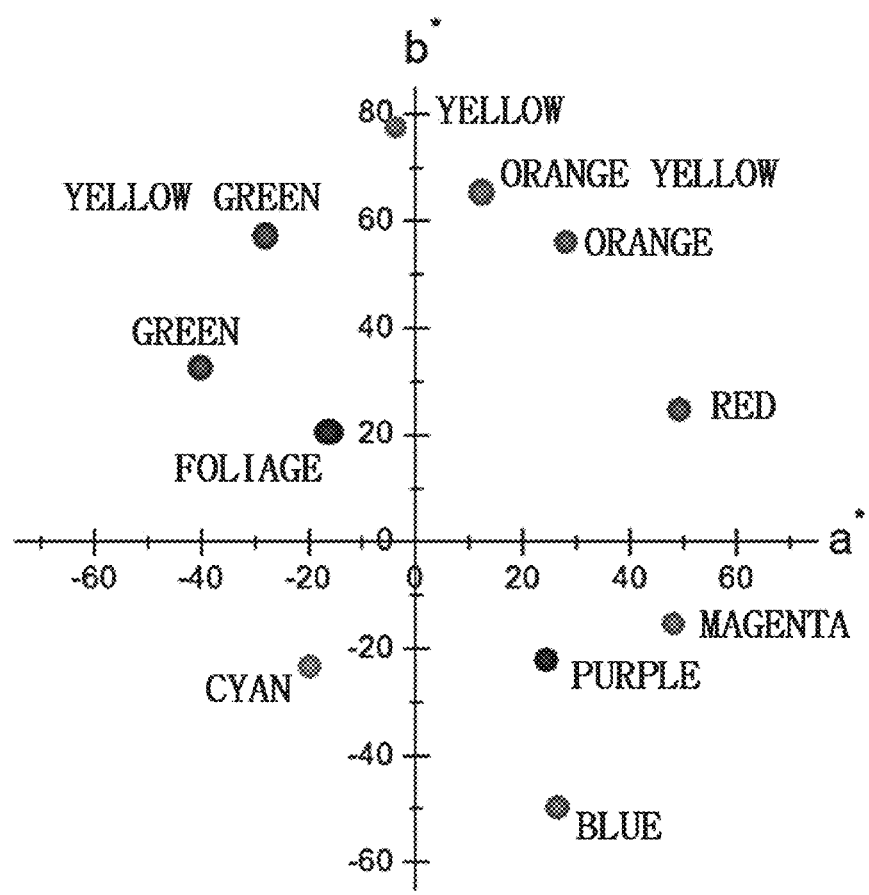
FIG. 10 is a graph showing colors of exemplary plasmonic nano-color coating layers according to various embodiments of the present disclosure on a color coordinate.

FIG. 10 shows the examples of colors achievable by the plasmonic nano-color coating layer according to various embodiments of the present disclosure, as the color coordinates projected on the a*b* plane of the CIE L*a*b* color space. FIG. 10 shows a distribution of color coordinates of samples which are fabricated using Au and Ag for the metal nano-particle layer and also using $SiO_2$ and $Al_2O_3$ for the matrix layer and the dielectric buffer layer. It may be understood that a very wide range of colors and chroma may be implemented only with a simple combination of materials system. Since the materials and nominal thicknesses of the metal nano-particle layer and the matrix layer may be combined in various ways, the range of achievable colors may also increase further.

According to an embodiment of the present disclosure, the chroma of the color of the coating layer may be proportional to the number of the metal particle layers. Hereinafter, the change of chroma and brightness of the coating layer depending on the number of metal nano-particle layers will be described with reference to FIG. 11.

Figure 11:
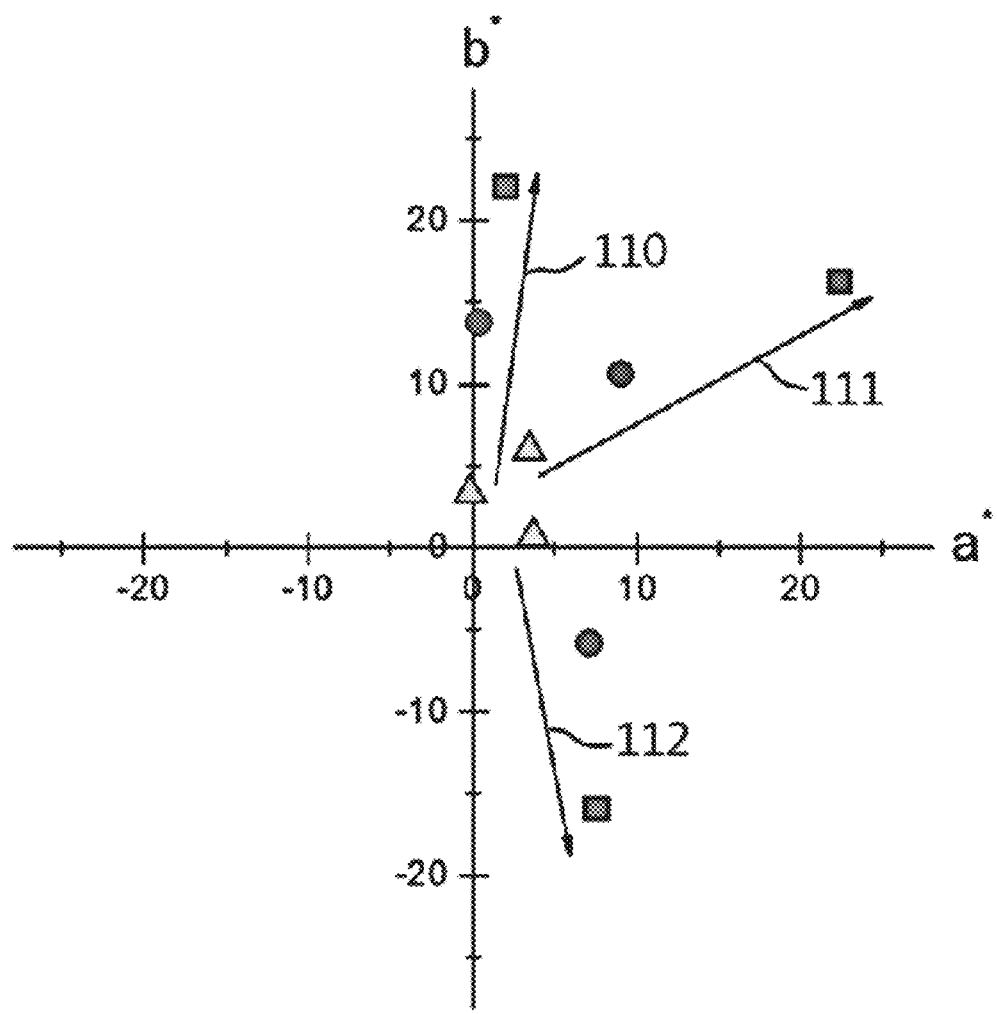
FIG. 11 is a graph showing the change of a color coordinate as a function of the number of metal nano-particle layers in the plasmonic nano-color coating layer according to an embodiment of the present disclosure.

FIG. 11 shows the change of a color distribution in the color coordinates as a function of the number of metal nano-particle layer. This color distribution was obtained from the samples in which the materials combination and the thicknesses of each layer are the same as the composite structures, composed of $SiO_2$ matrix layers and Ag nano-particle layers, representing gold 110, red 111, and blue 112 colors, except that the number of Ag nano-particle layers are here set to be 1 (△), 2 (○), and 3 (□). It is clear that the chroma defined as a distance from the origin increases in proportion to the number of metal nano-particle layers without causing much change in the hue, i.e. the color perceived. On the other hand, the brightness becomes higher when the number of metal nano-particle layers is smaller. For example, L* representing the brightness of the plasmonic nano-color coating layer corresponding to the reddish color 111 is 88.74 when the number of Ag nano-particle layer is 1, 76.15 when the number of Ag nano-particle layers is 2, and 59.84 when the number of Ag nano-particle layers is 3. Even though the hue values are similar, since the chroma gets lower and the brightness becomes higher as the number of Ag nano-particle layers decreases, the color obtained is not vivid but shows pale pastel tone colors. Therefore, it is possible to obtain a shallow tone of specific color by decreasing the number of metal particle layers.

Since the plasmonic nano-color coating layer according to an embodiment of the present disclosure is very thin on the order of few tens of nanometers excluding the mirror layer, and its coloring mechanism is based on the resonant optical absorption, the color change depending on the viewing angle should be highly restricted. Hereinafter, the change in color of the coating layer according to an incident angle will be described with reference to FIGS. 12 and 13.

Figure 12:
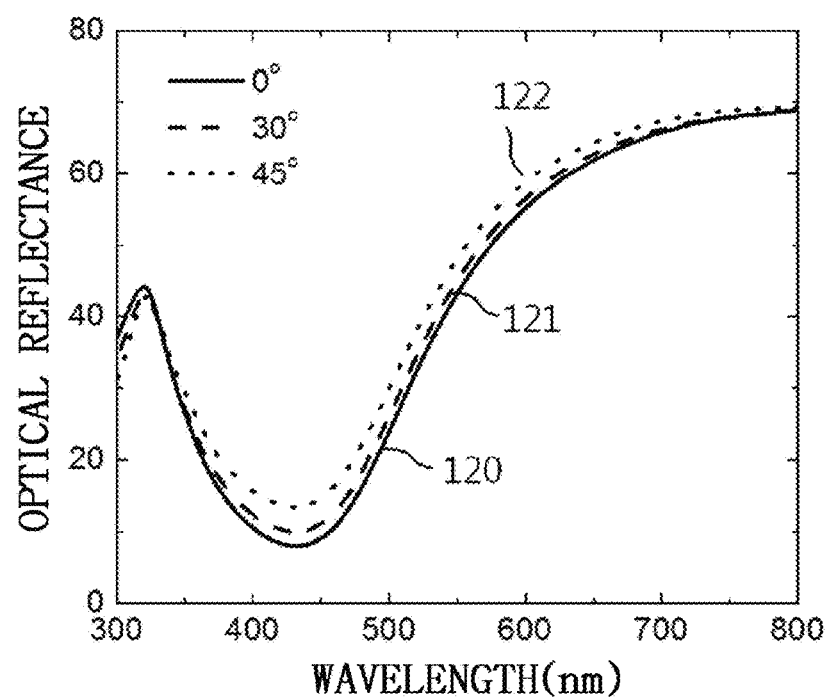
FIG. 12 illustrates a dependence of optical reflectance spectrum of the plasmonic nano-color coating layer on incident angles according to an embodiment of the present disclosure.

FIG. 12 shows the incident angle dependence of optical reflectance spectrum of the sample which consisted of an Al mirror layer pre-coated with a $SiO_2$ dielectric buffer layer of 10 nm thickness, and a composite layer formed on it. Here, the composite layer is composed of five Ag nano-particle layers of 1 nm nominal thickness and five $SiO_2$ matrix layers of 5 nm thickness which are alternately stacked. The sample shows a color of gold. As shown in FIG. 12, even though the incident angle increases from 0 degree (120) to 30 degree (121) and 45 degree (122), it may be found that the overall reflectance spectrum does not change much.

Figure 13:
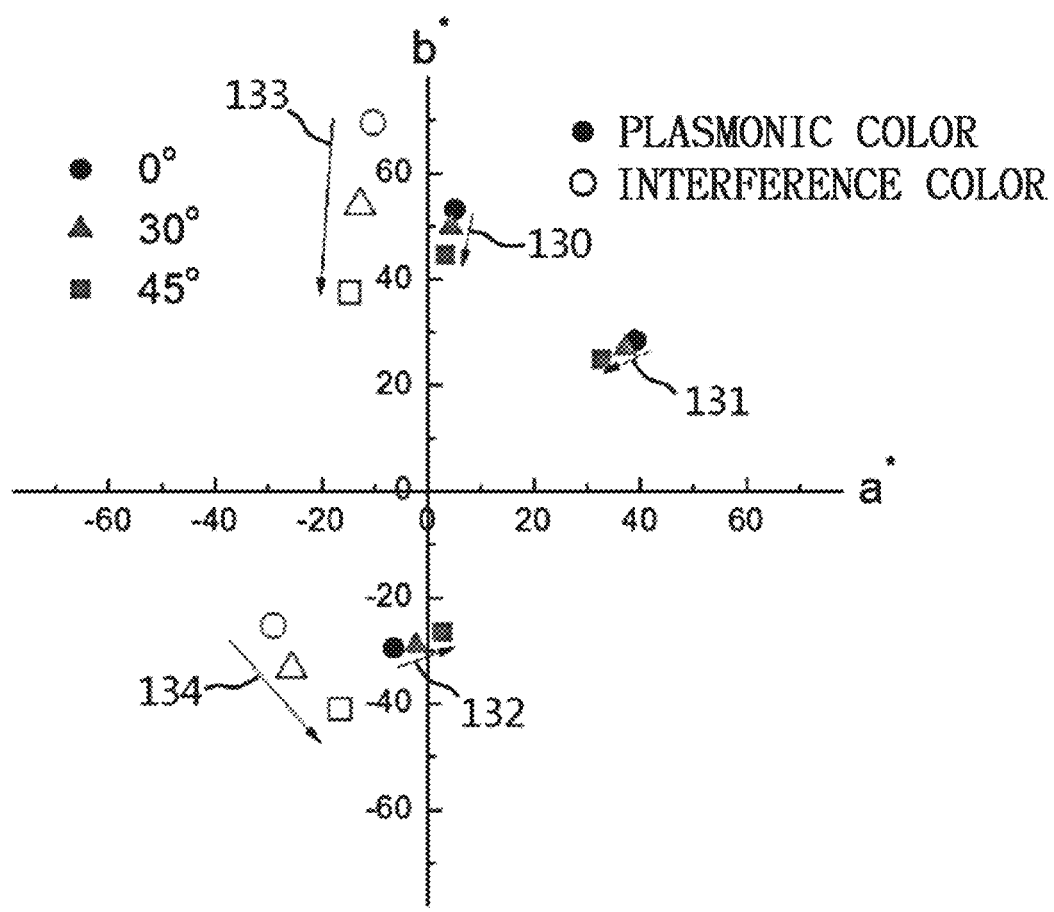
FIG. 13 is a graph showing the distribution of color coordinates as a function of incident angles for the Fabry-Perot color coating layer and for the plasmonic nano-color coating layer according to an embodiment of the present disclosure.

FIG. 13 quantitatively shows the change of the reflectance spectra depending on an incident angle using the CIE L*a*b* color coordinate system. Here, the distribution of color coordinates of the plasmonic nano-color coating samples which correspond to the colors of red 131 and blue 132 is also indicated, in addition to the coordinate 130 of the gold color sample whose optical reflectance spectrum is shown in FIG. 12. Moreover, in order to compare the plasmonic nano-color coating layer according to an embodiment of the present disclosure with a conventional interference color-based coating layer, distribution of color coordinates of Fabry-Perot color coating samples 133, 134 is also displayed together.

The Fabry-Perot structure is composed of upper and lower mirror layers and a dielectric layer interposed between them and having a thickness of $\lambda/4n$. Here, $\lambda$ represents a wavelength, and n represents a refractive index of the dielectric layer. The upper mirror layer is made of a semi-transparent thin metal layer so that the light may be incident through it and then be reflected from the lower mirror layer. The light reflected between both mirror layers gives rise to resonance-type interference so that only a light of a particular range of wavelengths causing constructive interference can be reflected out and the other lights disappear due to destructive interference, thereby showing a specific color. The lower mirror layer of the Fabry-Perot color coating layer employed in FIG. 13 is a Al film of 100 nm thickness deposited on a glass substrate. $Al_2O_3$ was used as a dielectric layer and a thin Au film of 10 nm thickness was deposited on the dielectric layer to be used as the upper semi-transparent mirror layer. FIG. 13 includes the results analyzed for the samples in which the $Al_2O_3$ dielectric layer has a thickness of 100 nm (134) and 150 nm (133). In the case that the $Al_2O_3$ dielectric layer has a thickness of 100 nm (134), a cyan color of greenish-blue was exhibited, and in the case of 150 nm thickness (133), a yellowish color appeared.

As shown in FIG. 13, it may be found that the Fabry-Perot color coating layers 133, 134 based on interference color give rise to very large color differences depending on a viewing angle, in comparison to the plasmonic nano-color coating layer. In fact, when compared using a parameter representing the color difference defined as the change of color location on the CIE L*a*b* coordinate system, the interference color resulted in color difference more than three times larger than that of the plasmonic color according to an embodiment of the present disclosure. In other words, the plasmonic nano-color coating layer according to an embodiment of the present disclosure may produce a color which does not change much according to a viewing angle.

In the plasmonic nano-color coating layer according to an embodiment of the present disclosure, the coating layer may have a thickness of 100 nm or less, or several tens of nanometers or less. Therefore, an inherent texture and the degree of surface haze of an underlayer used as a base body, may be fully reflected. In other words, this is very useful when implementing an elegant decorative effect of various metallic colors while maintaining a feel originating from an inherent texture of the underlayer. Hereinafter, the change of a maximum optical absorbance wavelength as a function of the nominal thickness of the metal nano-particle layer will be described for the plasmonic nano-color coating layer fabricated on a non-flat body, with reference to FIG. 14.

Figure 14:
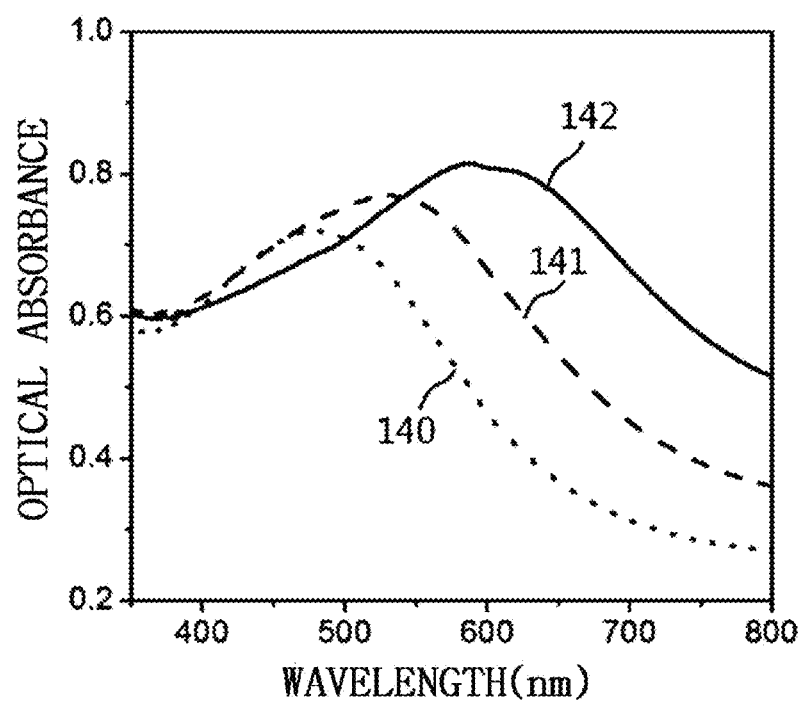
FIG. 14 illustrates an optical absorbance spectrum of a plasmonic nano-color coating layer deposited on a metal substrate treated with hairline finish according to an embodiment of the present disclosure.

FIG. 14 shows the total optical absorbance spectra, which are measured using an integrating sphere for the plasmonic nano-color coating layers deposited on a magnesium substrate treated with hairline finish to demonstrate the effect of the texture of an underlayer serving as a base body. A metal plate treated with hairline finish has minute scratches artificially formed on a metal surface to give diffuse reflection of light, and the metal plate is widely used in these days as an exterior material of a consumer electronics product since it gives a premium metallic feel. Since the hairline treatment increases light scattering from the underlayer and decreases the specular reflection component, the optical absorbance was obtained from the measured total reflectance including diffused reflection and specular reflection components by using an integrating sphere, in order to quantify the color coordinate accurately. As the nominal thickness of the Ag nano-particle layer increases from 2 nm (140) to 2.5 nm (141) and 3 nm (142), it may be found that the wavelength of maximum optical absorbance gradually red-shifted to a large extent, similar to the case of being deposited on a flat underlayer. In comparison to the samples in which specular reflection components are dominant, the color is distinguished for its metallic gloss of a pastel tone, in which the change in degree of gloss depending on a viewing angle is unnoticeable and the anti-glare effect is excellent. Therefore, according to an embodiment of the present disclosure, the plasmonic nano-color coating layer may further include a base body below the mirror layer, and the base body may be surface-treated to create a diffuse reflection. As described above, the plasmonic nano-color coating layer according to an embodiment of the present disclosure may implement various colors of high chroma while maintaining the metallic gloss and surface texture of the underlayer. The base body may be made of various organic or inorganic materials such as optical glass, plastic, metal or the like.

In the embodiment of the present disclosure, it is possible to change an effective optical constant of the multilayer stack and control an impedance matching condition in various ways by mixing different kinds of metal particles or modifying the nominal thicknesses of the metal nano-particle layers differently. In addition, it is expected that the color may be adjusted owing to the modified shape of the metal nano-particles by controlling a bonding characteristic between the materials constituting the matrix and the metal nano-particles.

The plasmonic nano-color coating layer according to an embodiment of the present disclosure may also be used as being coated on an aluminum flake of several hundred micron size, used as a metallic effect pigment, and dispersed in an automotive paint or the like to yield a metallic color of premium gloss.

In addition, according to an embodiment, the plasmonic nano-color coating layer may further include a base body located below the mirror layer; a protective layer located on the composite layer; and at least one adhesion layer formed on an interface between the base body and the mirror layer, an interface between the mirror layer and the dielectric buffer layer or an interface between the composite layer and the protective layer. In an embodiment, the adhesion layer may be made of transition metals, nitrides or oxides. For example, the adhesion layer for improving an adhesion at heterogeneous interfaces may be selected from transition metals such as Ti, W, Cr or the like, nitrides such as TiAlN, TiN, AlN, $Si_3N_4$ or the like, and oxides such as ITO, SnO, ZnO or the like.

In addition, since the separation between the metal nano-particle layers and the spacing between the metal nano-composite layer and the lower mirror layer have a significant effect on the implementation of resonance-type color with high chroma according to an embodiment of the present disclosure, if an active material responding to an external stimuli (electric field, light, temperature or the like) or environmental change (specific gas component, metal ion, biomaterial, pH, temperature, humidity or the like) is used for the matrix layer and the dielectric buffer layer, the coating layer of the present disclosure may be applied to a nanocolorimetric biochemical sensor or a tunable color filter, and it may also be used for highly sensitive devices since the change in color may be greatly amplified due to their enhanced signal-to-noise ratio and sensitivity even by a minute change of the external environment. Therefore, according to an embodiment of the present disclosure, the matrix layer and the dielectric buffer layer may be made of an active material responding to an external stimuli or an environmental change.

In addition, according to an embodiment of the present disclosure, the plasmonic nano-color coating layer may simultaneously implement a reflection-type color and a transmission color different from the reflected color, by adjusting the mirror layer to be thin enough for a certain amount of light to pass through it. Such a configuration is advantageous in that it may function as a half-mirror which is widely used as a display window of information devices of these days, and at the same time the color of the half-mirror may be diversified.

The present disclosure may be changed or modified in various ways by those skilled in the art without departing from the scope of the present disclosure, without being limited to the above embodiments and the accompanying drawings.

What is claimed is:

1. A plasmonic nano-color coating layer, comprising:
a composite layer comprising a plurality of metal particle layers and a plurality of matrix layers and having a periodic multilayer structure in which the metal particle layers and the matrix layers are alternately arranged;
a dielectric buffer layer located below the composite layer; and
a mirror layer located below the dielectric buffer layer,
wherein the color of the plasmonic nano-color coating layer is determined based on a nominal thickness of the metal particle layer and a separation between the metal particle layers.

2. The plasmonic nano-color coating layer according to claim 1,
wherein the chroma of the color of the coating layer is proportional to the number of the metal particle layers.

3. The plasmonic nano-color coating layer according to claim 1,
wherein the thickness of the matrix layer is 1 nm to 30 nm.

4. The plasmonic nano-color coating layer according to claim 3,
wherein the thickness of the matrix layer is 1 nm to 20 nm.

5. The plasmonic nano-color coating layer according to claim 1,
wherein the thickness of the dielectric buffer layer is 1 nm to 30 nm.

6. The plasmonic nano-color coating layer according to claim 5,
wherein the thickness of the dielectric buffer layer is 1 nm to 20 nm.

7. The plasmonic nano-color coating layer according to claim 1, further comprising a base body below the mirror layer,
wherein the base body is surface-treated to give a diffuse reflection.

8. The plasmonic nano-color coating layer according to claim 1,
wherein the materials of the matrix layer and the dielectric buffer layer are active materials which respond to an external stimulation or environmental change.

9. The plasmonic nano-color coating layer according to claim 1,
wherein the material of the mirror layer is a white metal, a colored metal, Al—N, Ti—N, Zr—N, Ta—N based nitride, Ti—C, W—C, Zr—C based carbide, a compound thereof or a mixture thereof.

10. The plasmonic nano-color coating layer according to claim 1,
wherein the material of the dielectric buffer layer is optically transparent.

11. The plasmonic nano-color coating layer according to claim 1, further comprising a protective layer located on the composite layer,
wherein the material of the protective layer is optically transparent.

12. The plasmonic nano-color coating layer according to claim 1, further comprising:
a base body located below the mirror layer;
a protective layer located on the composite layer; and
at least one adhesion layer formed on an interface of the base body and the mirror layer, an interface of the mirror layer and the dielectric buffer layer or an interface of the composite layer and the protective layer,
wherein the adhesion layer is made of transition metal, nitride or oxide.

13. The plasmonic nano-color coating layer according to claim 1, further comprising a base body below the mirror layer,
wherein the base body is an aluminum flake used as a metallic effect pigment of paint.

14. A method for forming a plasmonic nano-color coating layer, comprising:
forming a mirror layer on a base body to be colored;
forming a dielectric buffer layer on the mirror layer; and
forming a composite layer on the dielectric buffer layer, the composite layer including a plurality of metal particle layers and a plurality of matrix layers and having a periodic multilayer structure in which the metal particle layers and the matrix layers are alternately arranged, wherein a nominal thickness of the metal particle layer and a separation between the metal particle layers are determined based on the color to be realized.

15. The method for forming a plasmonic nano-color coating layer according to claim 14,
wherein the chroma of the color of the coating layer is proportional to the number of the metal particle layers.

16. The method for forming a plasmonic nano-color coating layer according to claim 14,
wherein the thickness of the matrix layer is 1 nm to 30 nm.

17. The method for forming a plasmonic nano-color coating layer according to claim 16,
wherein the thickness of the matrix layer is 1 nm to 20 nm.

18. The method for forming a plasmonic nano-color coating layer according to claim 14,
wherein the thickness of the dielectric buffer layer is 1 nm to 30 nm.

19. The method for forming a plasmonic nano-color coating layer according to claim 18,
wherein the thickness of the dielectric buffer layer is 1 nm to 20 nm.

20. The method for forming a plasmonic nano-color coating layer according to claim 14, before said forming the mirror layer, further comprising:
surface-treating the base body to give a diffuse reflection.

21. The method for forming a plasmonic nano-color coating layer according to claim 14, wherein the materials of the matrix layer and the dielectric buffer layer are active materials which respond to an external stimulation or environmental change.

22. The method for forming a plasmonic nano-color coating layer according to claim 14,
wherein the material of the mirror layer is a white metal, a colored metal, Al—N, Ti—N, Zr—N, Ta—N based nitride, Ti—C, W—C, Zr—C based carbide, a compound thereof or a mixture thereof.

23. The method for forming a plasmonic nano-color coating layer according to claim 14,
wherein the material of the dielectric buffer layer is optically transparent.

24. The method for forming a plasmonic nano-color coating layer according to claim 14, further comprising:
forming a protective layer on the composite layer,
wherein the material of the protective layer is optically transparent.

25. The method for forming a plasmonic nano-color coating layer according to claim 14, further comprising:
forming a protective layer on the composite layer; and
forming at least one adhesion layer on an interface of the base body and the mirror layer, an interface of the mirror layer and the dielectric buffer layer or an interface of the composite layer and the protective layer,
wherein the adhesion layer is made of transition metal, nitride or oxide.

26. The method for forming a plasmonic nano-color coating layer according to claim 14,
wherein the base body is an aluminum flake used as a metallic effect pigment of paint.

* * * * *